(12) United States Patent
Sugiura

(10) Patent No.: US 8,836,418 B2
(45) Date of Patent: Sep. 16, 2014

(54) HIGH FREQUENCY SEMICONDUCTOR SWITCH

(71) Applicant: Kabushiki Kaisha Toshiba, Tokyo (JP)

(72) Inventor: Masayuki Sugiura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/931,237

(22) Filed: Jun. 28, 2013

(65) Prior Publication Data

US 2014/0210543 A1 Jul. 31, 2014

(30) Foreign Application Priority Data

Jan. 25, 2013 (JP) .................... 2013-011754

(51) Int. Cl.
 *H01L 25/00* (2006.01)
 *H01L 23/66* (2006.01)
(52) U.S. Cl.
 CPC ...................... *H01L 23/66* (2013.01)
 USPC ........................... 327/565; 257/659
(58) Field of Classification Search
 CPC ............. H01L 2225/06537; H01L 2924/3025; H01L 23/5225
 USPC .......... 327/379, 551, 558, 564, 565; 361/816; 257/659; 334/85
 See application file for complete search history.

(56) References Cited

U.S. PATENT DOCUMENTS

| 6,836,172 B2 | 12/2004 | Okashita | |
|---|---|---|---|
| 6,853,072 B2 | 2/2005 | Asano et al. | |
| 8,134,224 B2 | 3/2012 | Sagae et al. | |
| 2004/0233648 A1* | 11/2004 | Ajioka et al. | 361/752 |
| 2011/0095806 A1 | 4/2011 | Seshita | |
| 2012/0280374 A1* | 11/2012 | Choi et al. | 257/659 |
| 2013/0134553 A1* | 5/2013 | Kuo et al. | 257/532 |
| 2014/0061866 A1* | 3/2014 | Lee | 257/621 |

FOREIGN PATENT DOCUMENTS

JP 2010-067664 3/2010

* cited by examiner

*Primary Examiner* — Lincoln Donovan
*Assistant Examiner* — Jung H Kim
(74) *Attorney, Agent, or Firm* — Patterson & Sheridan, LLP

(57) ABSTRACT

A switch circuit, a control circuit, a grounding wire and a control wire are formed on a substrate. The switch circuit connects an antenna terminal with one of multiple high frequency terminals. The control circuit outputs a control signal to the switch circuit. The grounding wire is disposed between the switch circuit and the control circuit and extends from a location proximate to an edge of the substrate to a location proximate to an opposite edge of the substrate. The control wire that carries the control signal is disposed between one end of the grounding wire and an edge of the semiconductor substrate.

20 Claims, 15 Drawing Sheets

W1 ... WIDTH

HIGH FREQUENCY SEMICONDUCTOR SWITCH

CROSS-REFERENCE TO RELATED APPLICATION

This application is based upon and claims the benefit of priority from Japanese Patent Application No. 2013-011754, filed Jan. 25, 2013, the entire contents of which are incorporated herein by reference.

FIELD

Embodiments relate generally to a high frequency semiconductor switch.

BACKGROUND

In recent years, there has been rapid progress in increasing performance of and functionalities in a high frequency semiconductor switch that is used in reception and transmission circuits for communication. In addition, there has been a strong demand for low cost, miniaturization, high integration, and low power consumption. To meet such demands, a High Electron Mobility transistor (HEMT) has been used as a substitute for compound semiconductor devices, and multiple high frequency semiconductor switches employing a Silicon On Insulator (SOI)-type MOS transistor in which the parasitic capacitance is smaller than a Metal Oxide Semiconductor (MOS) transistor formed on a silicon substrate and which is able to lower the power loss, are being developed.

For a high frequency semiconductor switch having a switch circuit and a control circuit mounted on the same semiconductor substrate, there is a problem that a high frequency signal leaks out to the control circuit to adversely affect the operation of the switch circuit. For a high frequency semiconductor switch that uses a digital modulation method, the design requirement on the switch is more stringent than with the conventional high frequency semiconductor switches, and includes low distortion and superior linearity.

DETAILED DESCRIPTION

Embodiments provide a high frequency semiconductor switch with low distortion and improved linearity.

In general, a high frequency semiconductor switch, according to an embodiment, includes a switch circuit on a substrate. The switch circuit is configured to connect an antenna terminal to a high frequency terminal selected from a plurality of high frequency terminals. The semiconductor switch also includes a control circuit on the substrate. The control circuit is configured to output a control signal for controlling selection of the high frequency terminal by the switch circuit. A grounding wire is disposed between and apart from the switch circuit and the control circuit and can function as an electrical shield between them. The grounding wire extends from a ground terminal located proximate to a first substrate edge to a second ground terminal located proximate to a second substrate edge opposite the first substrate edge. The semiconductor switch further includes a control wire for carrying the control signal between the control circuit and the switch circuit. The control wire is disposed between an end of the grounding wire and a substrate edge.

Embodiments will be described with reference to the drawings.

First Embodiment

At first, a high frequency semiconductor switch in accordance with a first embodiment is explained with reference to the drawings. In this embodiment, a grounding wire is provided between the switch circuit and a power supply circuit, a control wire is provided on the outside of the grounding wire to bypass the grounding wire and thus improve the linearity of the high frequency semiconductor switch.

Figure 1:
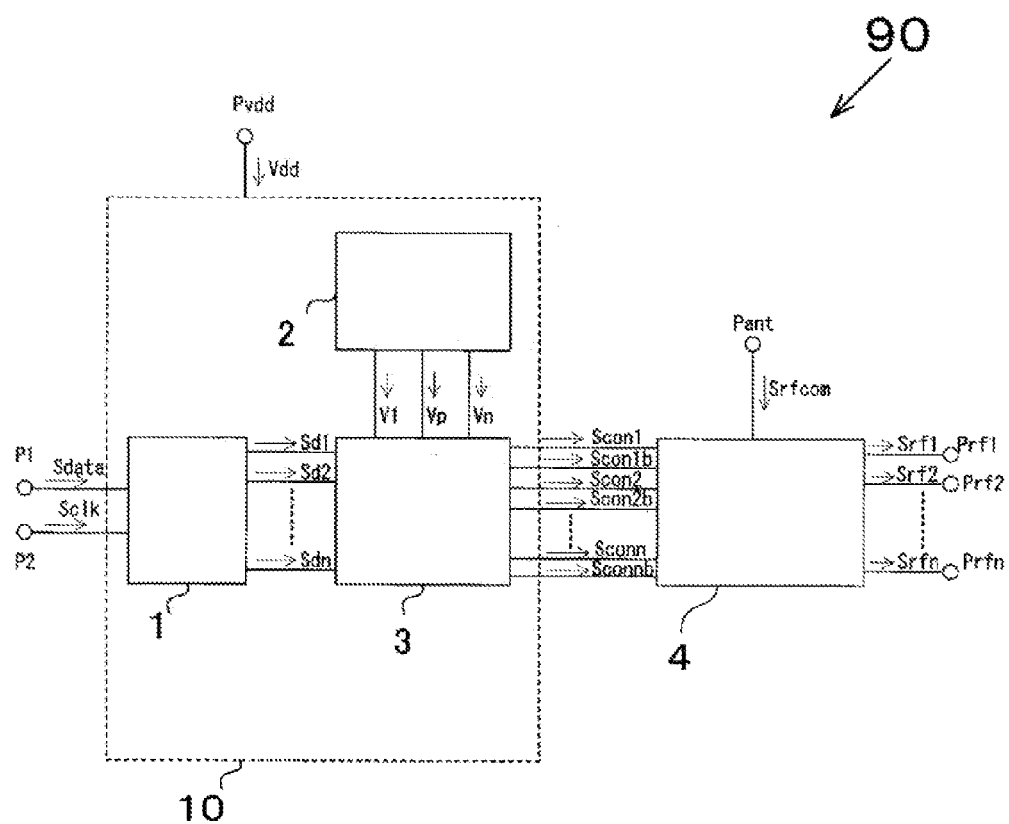
FIG. 1 is a block diagram illustrating a high frequency semiconductor switch according to a first embodiment.

As shown in FIG. 1, a high frequency semiconductor switch 90 is provided with a switch circuit 4, a control circuit 10, a terminal P1, a terminal P2, a terminal Pvdd, an antenna terminal Pant and RF terminals (high frequency terminals) Prf1 to n. The switch circuit 4 and the control circuit 10 are formed on the same semiconductor substrate (1 chip), and comprise an SOI (Silicon On Insulator)-type MOS (Metal Oxide Semiconductor) transistor formed on a SOI substrate.

The high frequency semiconductor switch 90 is a high frequency semiconductor switch that has the switch circuit 4, which is of a single pole n throw (SPnT) type. The high frequency semiconductor switch 90 is applied to a transmission circuit and a reception circuit for communication, and may be used, for example, in the transmission and the reception circuits of cell phones.

The control circuit 10 comprises a decoder 1, a power supply circuit 2, and a driver circuit 3. A power supply Vdd at the high potential side is supplied to the control circuit 10.

The decoder 1 receives a data signal Sdata through the terminal P1, and receives a clock signal Sclk through the terminal P2. The decoder 1 generates data signals Sd1 to Sdn (n bit of a decoder signal) that are parallel data signals after the decoding of data signal Sdata that is a serial data signal. The decoder 1 outputs the data signals Sd1 to Sdn to the driver circuit 3.

The power supply circuit 2 is supplied with the power supply Vdd at the high potential side, and generates a positive voltage V1, a positive voltage Vp, and a negative voltage Vn. The power supply circuit 2 outputs the positive voltage V1, the positive voltage Vp, and the negative voltage Vn to the driver circuit 3.

Here, the power supply Vdd at the high potential side is supplied from the outside of the high frequency semiconductor switch 90, and a voltage of the power supply Vdd at the high potential side is set to, for example, 3 V. The positive voltage Vp, for example, is set to 3.5 V. The negative voltage Vn, for example, is set to −1.4 V.

The driver circuit 3 inputs the data signals Sd1 to Sdn, the positive voltage V1, the positive voltage Vp, and the negative voltage Vn. The driver circuit 3 generates control signals Scon1 to Sconn and control signals Scon1b to Sconnb that control the switch circuit 4, and then outputs the signals to the switch circuit 4. Here, the control signal Scon1b is a reverse phase signal of the control signal Scon1; the control signal Scon2b is a reverse phase signal of the control signal Scon2, etc. and the control signal Sconnb is a reverse phase signal of the control signal Sconn.

The switch circuit 4 receives a common high frequency signal Srfcom through the antenna terminal Pant, and the control signals Scon1 to Sconn and the control signals Scon1b to Sconnb from the control circuit.

The switch circuit 4 outputs the common high frequency signal Srfcom as a high frequency signal Srf 1 through the RF terminal Prf1, in the case where the control signal Scon1 and the control signal Scon1b have an enabled state. The switch circuit 4 outputs the common high frequency signal Srfcom as a high frequency signal Srf2 through the RF terminal Prf2, in the case where the control signal Scon2 and the control signal Scon2b have an enabled state.

Similarly, the switch circuit 4 outputs the common high frequency signal Srfcom as a high frequency signal Srf n through the RF terminal Prfn, in the case where the control signal Sconn and the control signal Sconnb have an enabled state.

Figure 2:
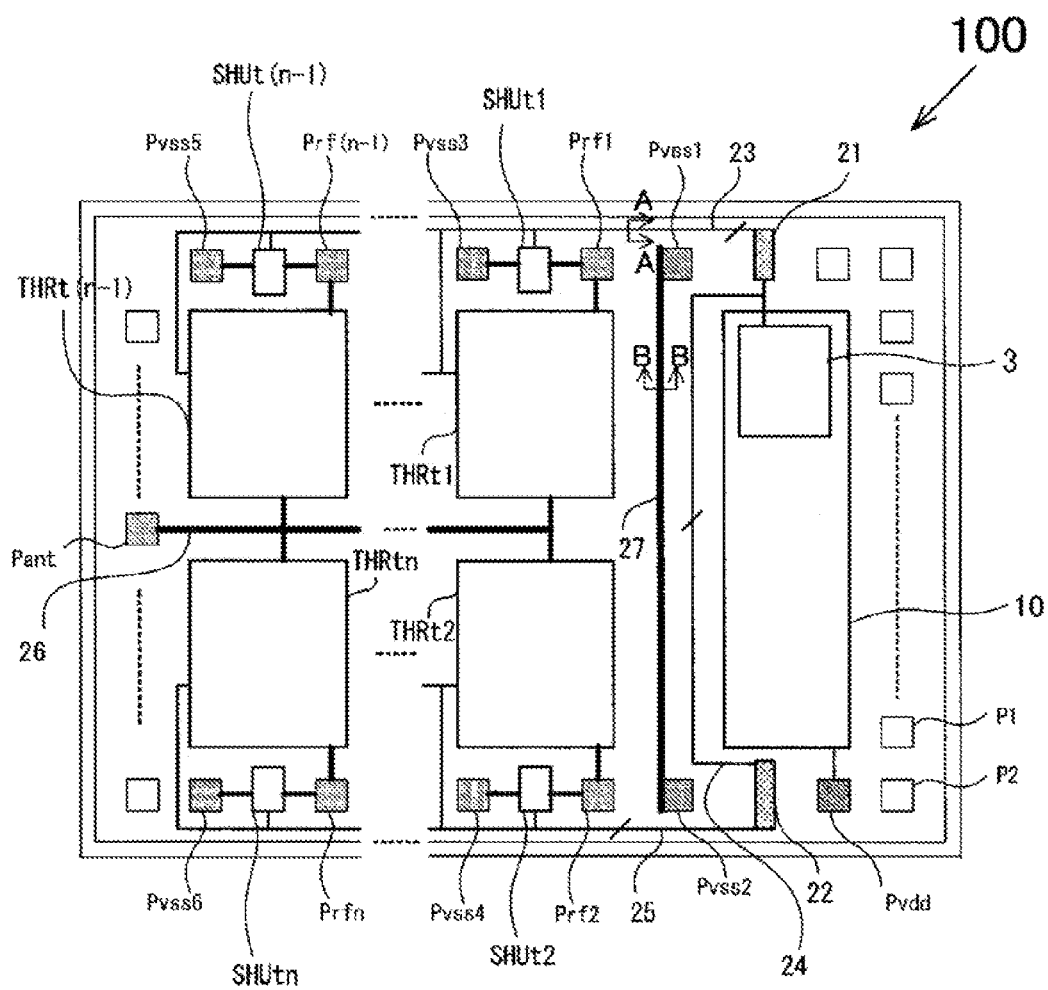
FIG. 2 is an outline plan view illustrating a high frequency semiconductor switch chip according to the first embodiment.

In the example depicted in FIG. 2, a high frequency semiconductor switch chip 100 has a rectangular shape. The high frequency semiconductor switch chip 100 is a semiconductor chip which incorporates the high frequency semiconductor switch 90.

The high frequency semiconductor switch chip 100 is provided with the control circuit 10, shunt FET parts SHUt1 to SHUtn, through FET parts THRt1 to THRtn, a resistor 21, a resistor 22, control wires 23 to 25, a signal wire 26, a grounding wire (a first grounding wire) 27, the antenna terminal Pant, the RF terminals Prf1 to Prfn, the terminal Pvdd, the terminal P1, the terminal P2, and grounding terminals Pvss1 to Pvss6. Here, n is an even number which is 2 or larger.

The control circuit 10, in this example, is configured at the right side of the high frequency semiconductor switch chip 100. The odd numbered shunt FET parts SHUt1, . . . , SHUt (n−1), and the odd numbered through FET parts THRt1, . . . , through THRt (n−1) are shown configured at the center and left side of the upper part of the high frequency semiconductor switch chip 100. The even numbered shunt FET parts SHUt 2, . . . , SHUtn, and the even numbered through FET parts THRt 2, . . . , through THRtn are configured at the center and left side of the lower part of the high frequency semiconductor switch chip 100.

The grounding wire 27 is between the shunt FET parts SHUt1 to SHUtn and the through FET parts THRt1 to THRtn (which may be collectively referred to as the switch circuit 4) and the control circuit 10, so as to cut off the shunt FET parts SHUt1 to SHUtn and the through FET parts THRt1 to THRtn (the switch circuit 4) and the control circuit 10. The grounding wire 27 is configured in a straight line that has a relatively wider wire width than that of the control wire and the signal wire. The grounding wire 27 connects the grounding terminal Pvss1 and the grounding terminal Pvss2. The grounding wire 27 extends at both ends to be longer than the switch circuit 4 and the control circuit 10, that is, the grounding wire extends past the projected width of the component structures of switch circuit 4 and control circuit 10.

The signal wire 26 connects the antenna terminal Pant, and the shunt FET parts SHUt1 through SHUtn and through FET parts THRt1 through THRtn. The common high frequency signal Srfcom is transmitted via the antenna terminal Pant to the switch circuit 4 using the signal wire 26.

The control wire 24 is provided between the control circuit 10 and the grounding wire 27, and connects the driver circuit 3 of the control circuit 10 and the resistor 21 and the resistor 22. The control signal Scon1, the control signal Scon1b, . . . , the control signal Scon(n—1), and the control signal Scon (n—1)b are transmitted using the control wire 24, and are transmitted to the odd numbered shunt FET parts and the through FET parts via the resistor 21 and the control wire 23. The control signal Scon 2, the control signal Scon 2b, . . . , the control signal Sconn, and the control signal Sconnb are transmitted using the control wire 24, and are transmitted to the even numbered shunt FET parts and the through FET parts via the resistor 22 and the control wire 25.

The control wire 23 is provided at the upper peripheral side of the high frequency semiconductor switch chip 100, so as to avoid the grounding wire 27 and the grounding terminal Pvss1. The control wire 23 is connected to the odd numbered shunt FET part SHUt1, . . . , shunt FET part SHUt (n−1), the through FET part THRt1, . . . , through FET part THRt (n−1) from the outer peripheral side of the high frequency semiconductor switch chip 100.

The control wire 25 is provided at the lower peripheral side of the high frequency semiconductor switch chip 100, so as to avoid the grounding wire 27 and the grounding terminal Pvss2. The control wire 25 is connected to the even numbered shunt FET part SHUt 2, . . . , shunt FET part SHUtn, the through FET part THRt 2, . . . , through FET part THRtn from the outer peripheral side of the high frequency semiconductor switch chip 100.

By arranging the grounding wire 27 as mentioned above, it is possible to suppress the leakage of the high frequency signal to the control circuit 10, and thereby reduce the influence on the operation of the switch circuit 4.

The shunt FET part SHUt1 is provided on the central upper part of the high frequency semiconductor switch chip 100. The shunt FET part SHUt1 is connected to the control wire that transmits the control signal Scon1b in the control wire 23. The through FET part THRt1 is provided on the central upper part of the high frequency semiconductor switch chip 100. The through FET part THRt1 is connected to the control wire that transmits the control signal Scon1 in the control wire 23. The occupied area of the through FET part THRt1 is larger than the shunt FET part SHUt1.

The shunt FET part SHUt (n−1) is provided on the left upper part of the high frequency semiconductor switch chip 100. The shunt FET part SHUt (n−1) is connected to the control wire that transmits the control signal Scon(n−1)b in the control wire 23. The through FET part THRt (n−1) is provided on the left upper part of the high frequency semiconductor switch chip 100. The through FET part THRt (n−1) is connected to the control wire that transmits the control signal Scon (n−1) in the control wire 23. The occupied area of the through FET part THRt (n−1) is larger than the shunt FET part SHUt (n−1).

The shunt FET part SHUt 2 is provided on the central lower part of the high frequency semiconductor switch chip 100. The shunt FET part SHUt 2 is connected to the control wire that transmits the control signal Scon2b in the control wire 25. The through FET part THRt 2 is provided on the central lower part of the high frequency semiconductor switch chip 100. The through FET part THRt 2 is connected to the control wire that transmits the control signal Scon2 in the control wire 25. The occupied area of the through FET part THRt 2 is larger than the shunt FET part SHUt 2.

The shunt FET part SHUtn is provided on the left lower part of the high frequency semiconductor switch chip 100. The shunt FET part SHUtn is connected to the control wire that transmits the control signal Sconnb in the control wire 25. The through FET part THRtn is provided on the left lower part of the high frequency semiconductor switch chip 100. The through FET part THRtn is connected to the control wire that transmits the control signal Sconn in the control wire 25. The occupied area of the through FET part THRtn is larger than the shunt FET part SHUtn.

The resistor 21 that is connected to the control wire 24 is connected only to the odd numbered control wires of control wire 24; and the resistor 22 that is connected to the control wire 24 is connected only to the even numbered control wires of control wire 24. The resistor 21 and the resistor 22 function to suppress the leakage of the high frequency signal to the side of the control circuit 10 through the gate capacity of the FET. In order that the resistor 21 and the resistor 22 have a resistor value sufficiently larger than the impedance produced by the gate capacitance, it is preferable to set the resistor, for example, at about tens of kΩ.

Figure 3:
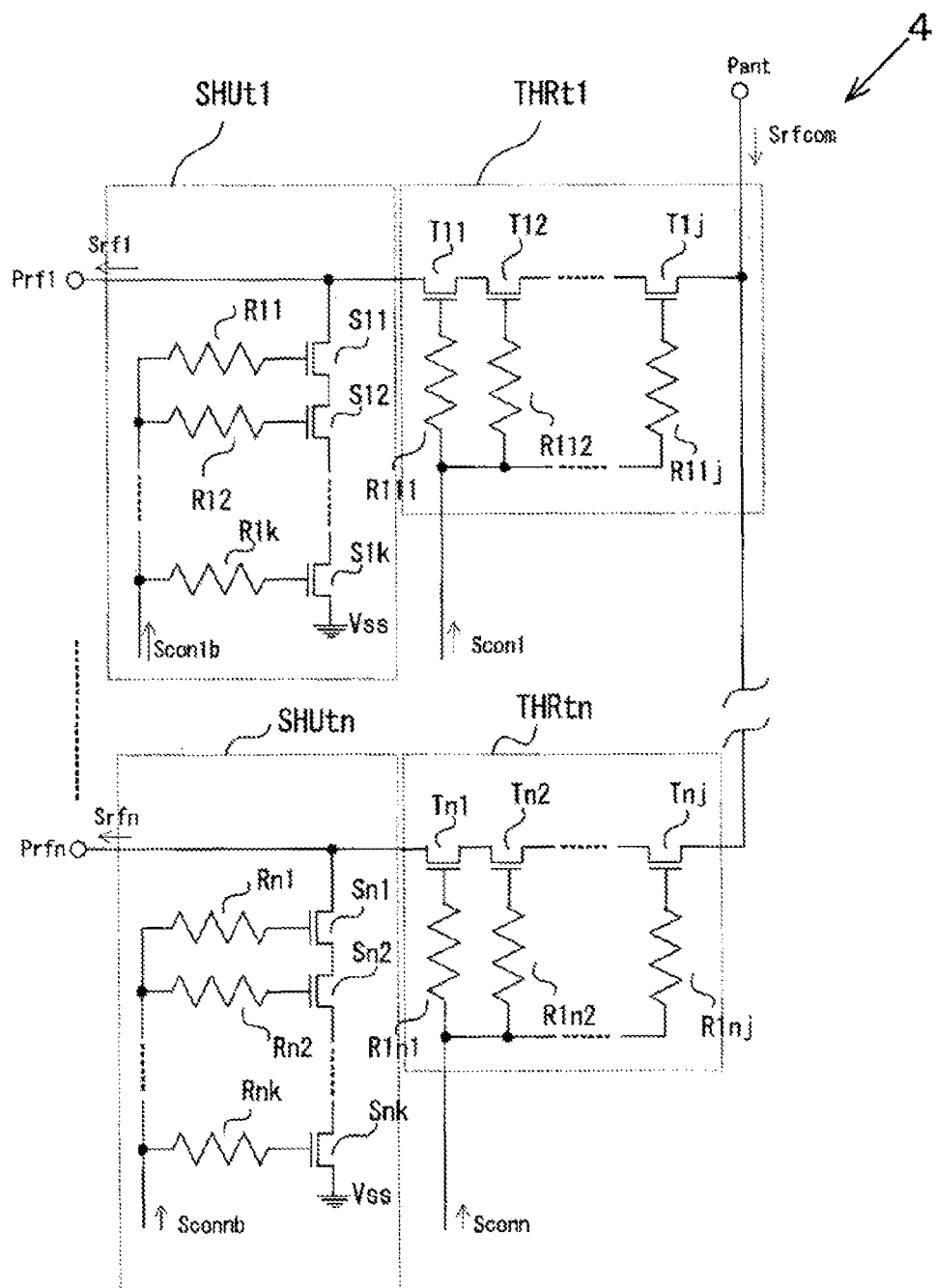
FIG. 3 is a circuit diagram illustrating the configuration of a switch circuit according to the first embodiment.

As shown in FIG. 3, the shunt FET part SHUt1 of the switch circuit 4 is provided with a resistor R11, a resistor R12, a resistor R1k, a shunt transistor S11, a shunt transistor S12 and a shunt transistor S1k. The through FET part THRt1 of the switch circuit 4 is provided with a resistor R111, a resistor R112, a resistor R11j, a through transistor T11, a through transistor T12, and a through transistor T1j.

Here, k pieces of the cascaded shunt transistor S11, shunt transistor S12, . . . , and shunt transistor S1k are provided between the terminal Prf1 side and a low-potential side power supply Vss (ground potential). Also, j pieces of the cascaded through transistor T11, through transistor T12, . . . , and through transistor T1j are provided between the terminal Prf1 side and the antenna terminal Pant side.

The resistor R11 is provided at a gate of the shunt transistor S11. The resistor R12 is provided at a gate of the shunt transistor S12. The resistor R1k is provided at a gate of the shunt transistor S1k. The resistor R111 is provided at a gate of the through transistor T11. The resistor R112 is provided at a gate of the through transistor T12. The resistor R11j is provided at a gate of the through transistor T1j.

The shunt FET part SHUtn of the switch circuit 4 is provided with a resistor Rn1, a resistor Rn2, a resistor Rnk, a shunt transistor Sn1, a shunt transistor Sn2, and a shunt transistor Snk. The through FET part THRtn of the switch circuit 4 is provided with a resistor R1n1, a resistor R1n2, a resistor R1nj, a through transistor Tn1, a through transistor Tn2, and a through transistor Tnj.

The k pieces of the cascaded shunt transistor Sn1, shunt transistor Sn2, . . . , and shunt transistor Snk are provided between the terminal Prfn side and the low-potential side power supply Vss (ground potential). The j pieces of the cascaded through transistor Tn1, through transistor Tn2, . . . , and through transistor Tnj are provided between the terminal Prfn side and the antenna terminal Pant side.

The resistor Rn1 is provided at a gate of the shunt transistor Sn1. The resistor Rn2 is provided at a gate of the shunt transistor Sn2. The resistor Rnk is provided at a gate of the shunt transistor Snk. The resistor R1n1 is provided at a gate of the through transistor Tn1. The resistor R1n2 is provided at a gate of the through transistor Tn2. The resistor R1nj is provided at a gate of the through transistor Tnj.

Figure 4:
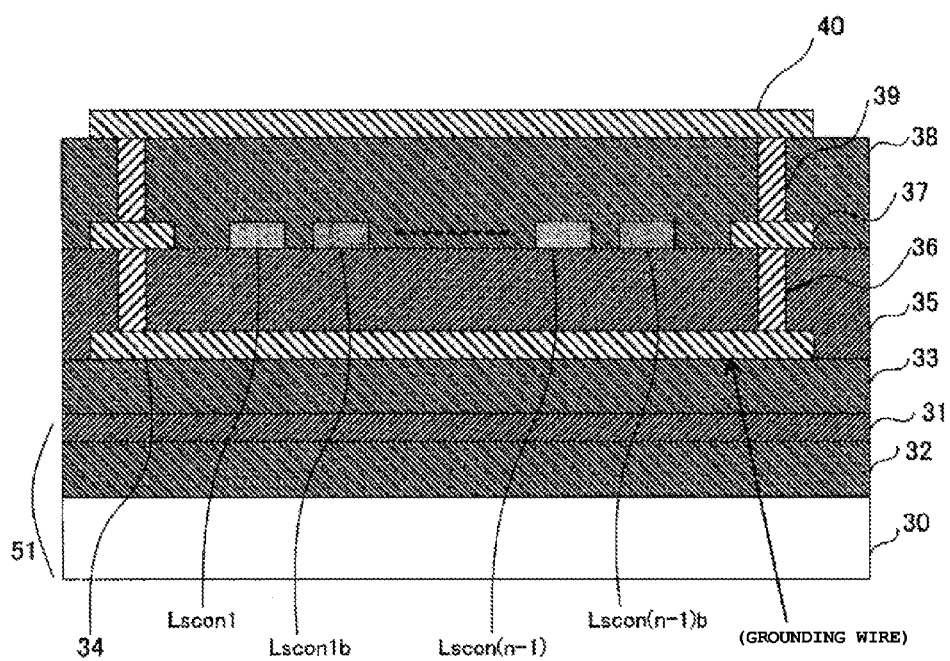
FIG. 4 is a cross-sectional view along the line A-A depicted in FIG. 2.

The control wire that transmits the control signal is surrounded by a grounding wire (comprising elements 34, 36, 37, 39, and 40) through an insulating film in the cross-sectional direction of the high frequency semiconductor switch chip 100 as shown in FIG. 4.

To be more specific, on the upper part of the high frequency semiconductor switch chip 100, a control wire Lscon1, a control wire Lscon1b, . . . , a control wire Lscon (n−1), and a control wire Lscon(n−1)b are provided on an interlayer insulating film 35. The control wire Lscon1, the control wire Lscon1b, . . . , the control wire Lscon(n−1), and the control wire Lscon(n−1)b are disposed in a second layer wiring 37. The control wire Lscon1 transmits the control signal Scon1. The control wire Lscon1b transmits the control signal Scon1b. The control wire Lscon(n−1) transmits the control signal Scon(n−1). The control wire Lscon(n−1)b transmits the control signal Scon(n−1)b.

The grounding wire surrounds the control wire Lscon1, the control wire Lscon1b, . . . , the control wire Lscon(n−1), and the control wire Lscon(n−1)b, and the grounding wire comprises a first layer wiring 34, the second layer wiring 37, a third layer wiring 40, a via 36, and a via 39. The first layer wiring 34 is provided on a Shallow Trench Isolation (STI) structure formed on an SOI substrate 51 through and on an interlayer insulating film 33. The second layer wiring 37 is provided on the interlayer insulating film 35. The third layer wiring 40 is provided on an interlayer insulating film 38. The via 36 is buried in an opening part of the interlayer insulating film 35, so as to connect the first layer wiring 34 and the second layer wiring 37. The via 39 is buried in an opening part of the interlayer insulating film 38, so as to connect the second layer wiring 37 and the third layer wiring 40.

Here, the control wire is surrounded by the grounding wire in the vicinity of the shunt FET parts and the through FET parts. The ground terminals (e.g., Pvss1 to 6) are set to the same ground potential (also referred to as the ground potential).

Figure 5:
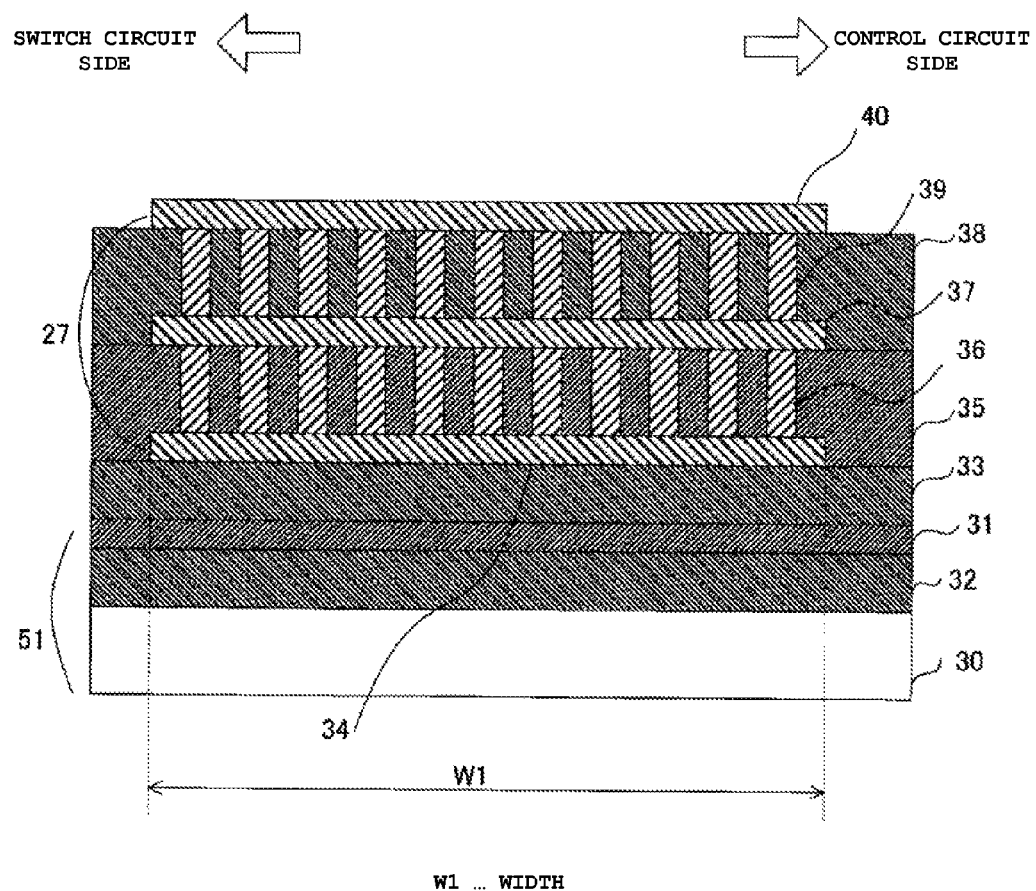
FIG. 5 is a cross-sectional view along the line B-B depicted in FIG. 2.

As shown in FIG. 5, the grounding wire 27 comprises the first layer wiring 34, the second layer wiring 37, the third layer wiring 40, the via 36, and the via 39. The first layer wiring 34, the second layer wiring 37 and the third layer wiring 40 have a width W1, and the lamination layer is formed through the interlayer insulating film (the width is wider than the control wires 23 to 25 and the signal wire 26). The via 36 and the via 39 are configured between the switch circuit 4 and the control circuit 10, for example, in 11 columns formed in parallel.

Figure 6:
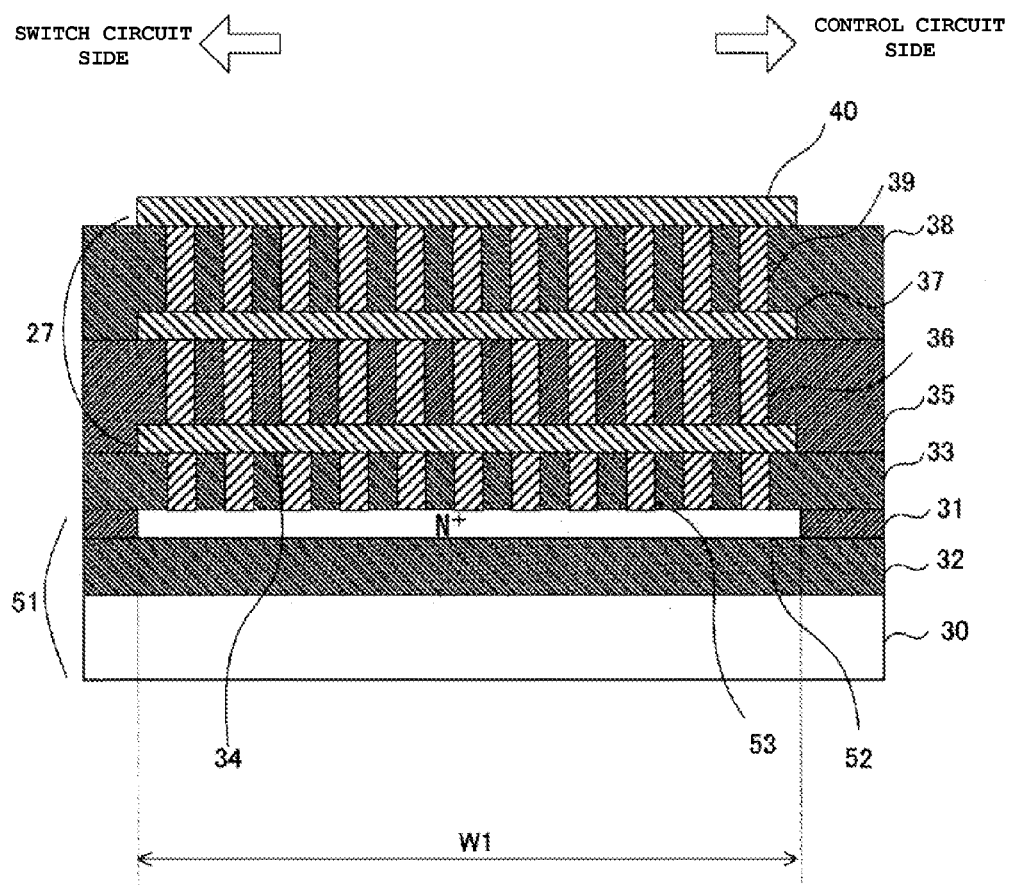
FIG. 6 is a cross-sectional view illustrating a first modified embodiment.

Here, the grounding wire 27 is provided on the STI structure, and the grounding wire can also be provided on an N+ Layer 52 which is formed on the SOI Substrate 51 as shown in a first modified embodiment in FIG. 6.

As described in the above paragraphs, the high frequency semiconductor switch in this embodiment is provided with the grounding wire 27 that has the width W1 and is disposed between the switch circuit 4 and the control circuit 10, so as to isolate the switch circuit 4 from the control circuit 10, and suppress interference between the circuit blocks. The odd numbered shunt FET parts and through FET parts are provided on the upper end part of the high frequency semiconductor switch chip 100. The even numbered shunt FET parts and through FET parts are provided on the lower end part of the high frequency semiconductor switch chip 100. The control wire 23 is connected to the odd numbered shunt FET parts and through FET parts from the upper end part of the high frequency semiconductor switch chip 100, so as to bypass the grounding wire 27 and the grounding terminal Pvss1. The control wire 25 is connected to the even numbered shunt FET parts and through FET parts from the lower end part of the high frequency semiconductor switch chip 100, so as to bypass the grounding wire 27 and the grounding terminal Pvss2. Because of this, it is possible to suppress the wrap-around of the high frequency signal to the control circuit 10.

Because the control wires 23 and 25 are surrounded by a grounding wire in a cross-sectional direction (e.g., as depicted in FIG. 4), it is possible to improve shielding. Because the shunt FET parts are provided on the end side of the high frequency semiconductor switch chip 100, and the through FET parts are provided on the inside of the high frequency semiconductor switch chip 100, and the control wires are configured alternately, it is possible for the signals in each of the respective control wires to have opposite (or different) phases without causing interference between the signals. Therefore, it is possible to suppress the leakage of the high frequency signal to the control circuit 10, and provide a high frequency semiconductor switch 90 with improved linearity and low distortion.

In addition, the high frequency semiconductor switch 90 in this embodiment is not only limited to the application in cell phones. For example, the switch can also be applicable in other telecommunication devices, signal processing in general, and cars.

Second Embodiment

Figure 7:
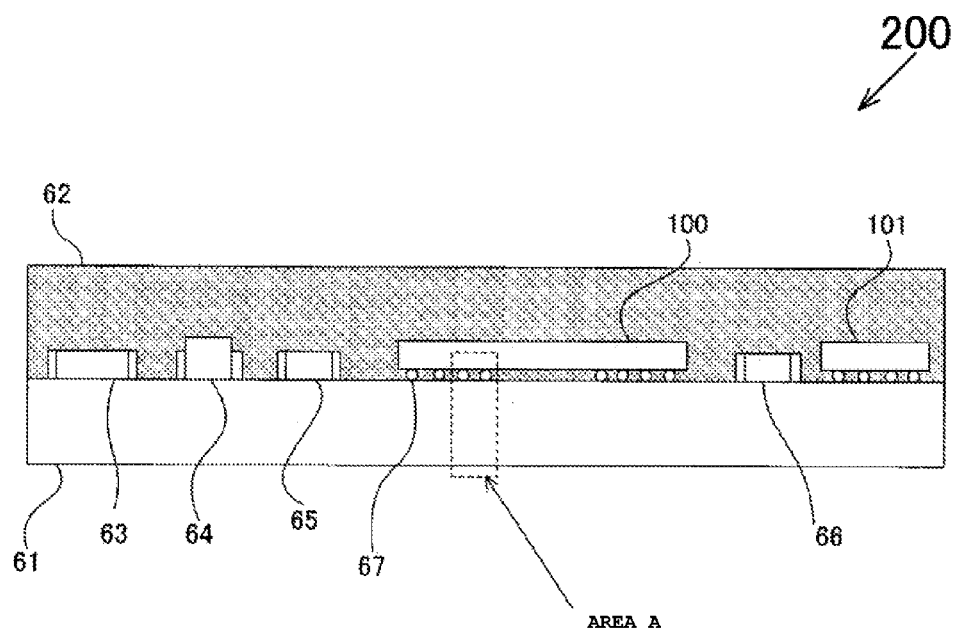
FIG. 7 is a schematic cross-sectional view illustrating a module according to a second embodiment.
Figure 8:
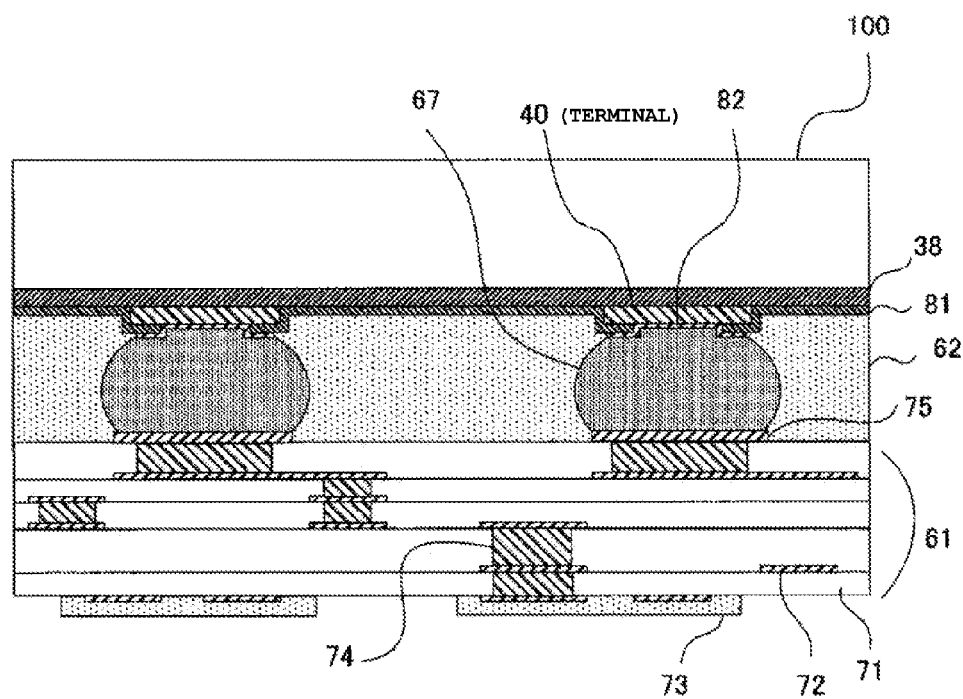
FIG. 8 is an enlarged cross-sectional view of an area A in FIG. 7.

Next, a high frequency semiconductor switch in accordance with a second embodiment is explained with reference to the drawings. FIG. 7 is a schematic cross-sectional view showing a device module. FIG. 8 is an enlarged cross-sectional view of an area A in FIG. 7. In this embodiment, as a substitute for a bonding wire, a bump connection is used to decrease the parasitic inductance.

In the following description, for the parts that are same as the parts in the first embodiment, the same reference numeral are used, and their descriptions are omitted; only differences will be described.

As shown in FIG. 7, a module 200 is provided with a circuit substrate 61, a sealing material 62, electronic components 63 to 66, a bump 67, a high frequency semiconductor switch chip 100, and an IC chip 101. The module 200 is a module used, for example, in the cell phones.

The electronic components 63 to 66 are mounted on the first main surface of the circuit substrate 61. The high frequency semiconductor switch chip 100 is connected to the circuit substrate 61 through the bump 67. The IC chip 101 is connected to the circuit substrate 61 through the bump 67. The electronic components 63 to 66, the bump 67, the high frequency semiconductor switch chip 100, and the IC chip 101 are sealed with the sealing material 62.

As shown in FIG. 8, the high frequency semiconductor switch chip 100 and the circuit substrate 61 are connected face to face through the bump 67.

As depicted in FIG. 8, the circuit substrate 61 is a circuit substrate including five layers, comprising an insulating substrate 71, a wiring layer 72, an insulating film 73, a via 74, and a connecting terminal 75. The insulating substrate 71, for example, is made of ceramic or an organic insulating material. The connecting terminal 75 is provided on the surface (the first main surface) of the circuit substrate 61. The Connecting terminal 75 is connected to the wiring layer 72 inside of the circuit substrate 61 through the via 74. The wiring layer 72 which is provided on the back (the second main surface) of the circuit substrate 61 is covered with the insulating film 73 except the area where the connection between the module and an external substrate (not shown) is made. The wiring layer 72 of the insulating substrate 71 is connected through the via 74.

The high frequency semiconductor switch chip 100 is provided with the third layer wiring 40 (terminal) which extends through the interlayer insulating film 38. A surface protection film 81 is provided on the interlayer insulating film 38 and an end part of the third layer wiring 40 (terminal). A barrier metal 82 is provided on the portion of the third layer wiring 40 (terminal) left exposed by the surface protection film 81.

The connecting terminal 75 and the barrier metal 82 are connected via bump 67. The connecting terminal 75, the surface protection film 81, and the barrier metal 82 are sealed with the sealing material 62.

As described in the above paragraphs, in the high frequency semiconductor switch of this embodiment, the high frequency semiconductor switch chip 100 and the circuit substrate 61 are connected face to face using the bump 67. Because the connecting terminal 75 and the barrier metal 82 are not connected with a bonding wire, it is possible to decrease the parasitic inductance, and there is no need of an extraction wiring area to allow for the use of a bonding wire. The grounding wire of the high frequency semiconductor switch chip 100 may thus be connected to the grounding wire of the module 200 with low impedance.

Therefore, compared with the case when the bonding wire is used, the shield effect is strengthened, and it is possible to provide the high frequency semiconductor switch with low distortion.

Third Embodiment

Figure 9:
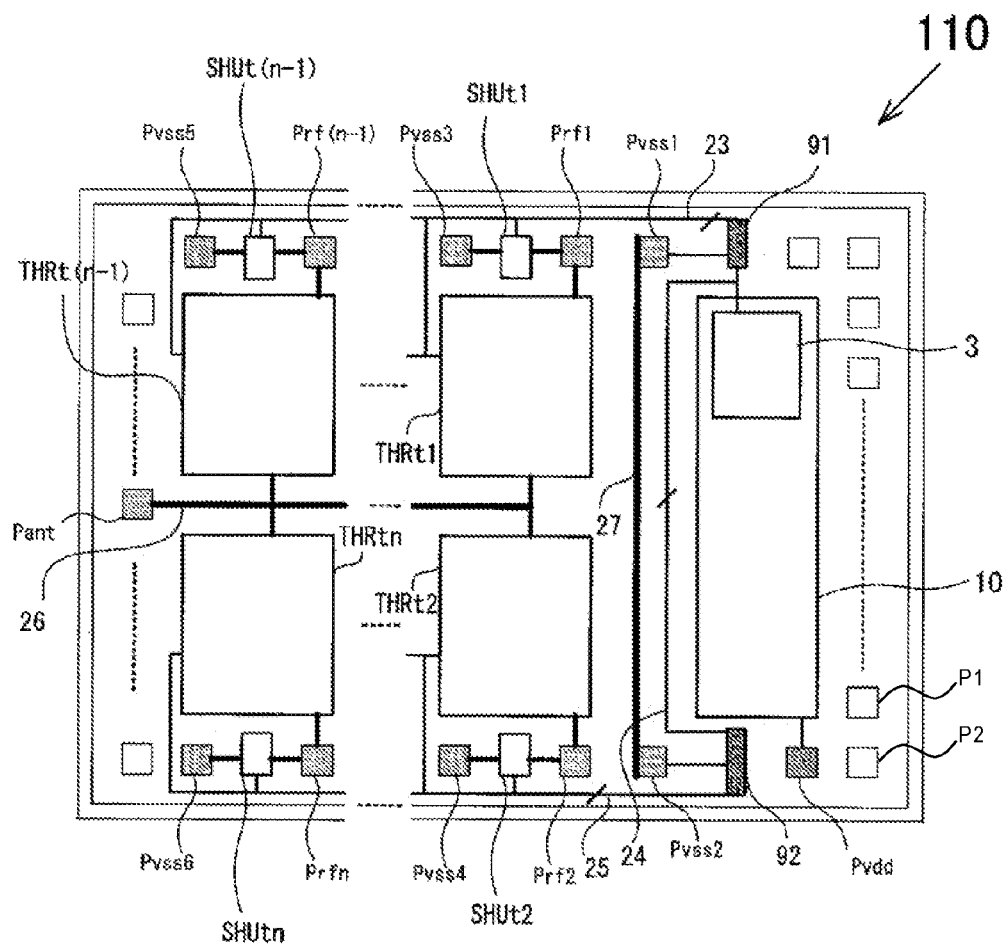
FIG. 9 is an outline plan view illustrating a high frequency semiconductor switch chip according to a third embodiment.
Figure 10:
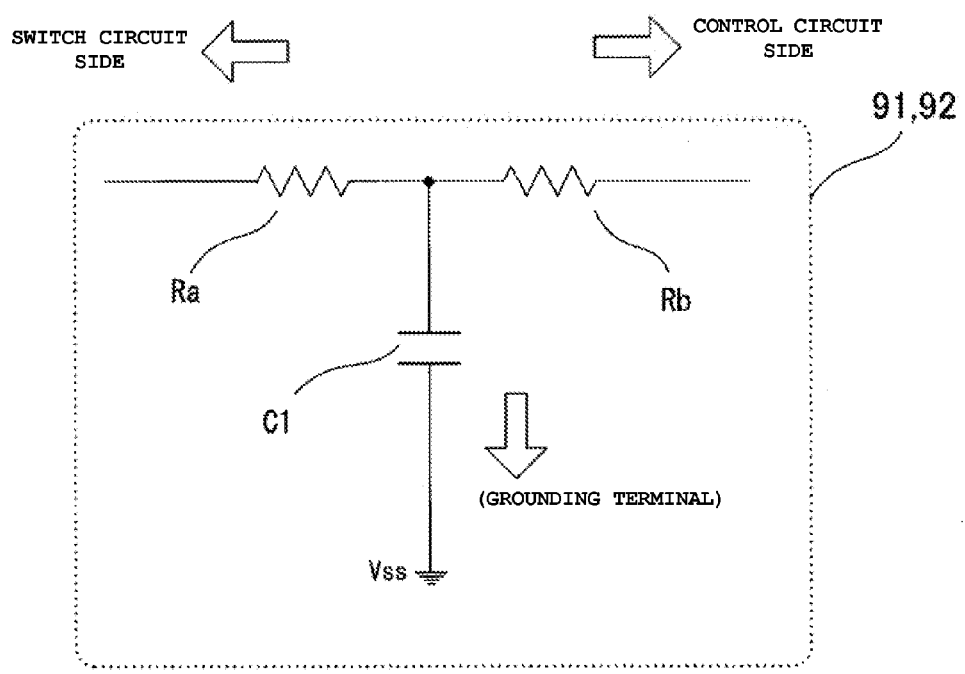
FIG. 10 is a circuit diagram illustrating the configuration of a filter circuit according to the third embodiment.

Next, a high frequency semiconductor switch according to a third embodiment is explained with reference to the drawings. FIG. 9 is an outline plan view showing a high frequency semiconductor switch chip. FIG. 10 is a circuit diagram depicting the configuration of a filter circuit. In this embodiment, the filter circuit is provided on the control wire near a driver circuit, which can significantly suppress the leakage of the high frequency signal to the control circuit.

In the following description, for the parts that are same as the parts in the first embodiment, the same reference numerals are used, and their descriptions are omitted; only the differences will be described.

As depicted in FIG. 9, a high frequency semiconductor switch chip 110 has a rectangular shape. The high frequency semiconductor switch chip 110 is provided with a control circuit 10, shunt FET parts SHUt1 to SHUtn, through FET parts THRt1 to THRtn, control wires 23 to 25, a signal wire 26, a grounding wire 27, a filter circuit 91, a filter circuit 92, an antenna terminal Pant, RF terminals Prf1 to Prfn, a terminal Pvdd, a terminal P1, a terminal P2, and grounding terminals Pvss1 to Pvss6. The filter circuit 91 and the filter circuit 92 function as a low pass filter.

The filter circuits 91 are arranged on the right upper part of the high frequency semiconductor switch chip 110, and the number of the filter circuit 91 is the same as the number of the odd numbered control wires. The filter circuit 91 is arranged on the control wire 24 near driver circuit 3, and is connected to the grounding terminal Pvss1, for example. The filter circuits 92 are arranged on the right lower part of the high frequency semiconductor switch chip 110, and the number of the filter circuit 92 is the same as the number of the even numbered control wires. The filter circuit 92 is arranged on the control wire 24 near the driver circuit 3, and is connected to the grounding terminal Pvss2, for example.

As shown in FIG. 10, the filter circuit 91 and the filter circuit 92 are provided with a capacitor C1, a resistor (first resistor) Ra, and a resistor (second resistor) Rb.

One end of the resistor Ra is provided on a side of the switch circuit 4. One end of the resistor Rb is connected to the other end of the resistor Ra, and the other end of the resistor Rb is connected to a side of the control circuit 10. One end of the capacitor C1 is connected to the other end of the resistor Ra and the one end of the resistor Rb, the other end is connected to a low-potential side power supply (ground potential) Vss via a grounding terminal.

In this embodiment, the resistor is configured in two directions, so that the signal that is leaked to the control circuit 10 will not be transmitted to the switch circuit 4 again; however, it is not necessarily limited to this configuration. For example, providing one resistor or three resistors or more is acceptable as well.

Here, the capacity of the capacitor C1 is set to, for example, several pF. The value of the resistor Ra and the resistor Rb is set to, for example, in the range of several kΩ-5 kΩ.

Figure 11A:
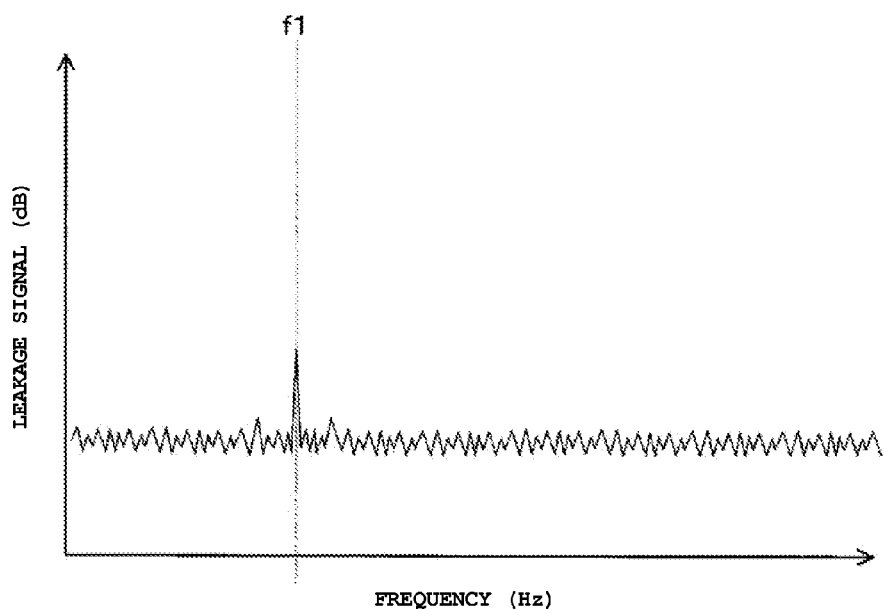
FIGS. 11A and 11B depict the leakage of a high frequency signal in accordance with the third embodiment.

Next, the characteristics of the high frequency semiconductor switch are explained with reference to FIG. 11 and FIG. 12. FIG. 11A depicts the characteristics of the leakage of the high frequency signal in this embodiment provided with the filter circuit, and FIG. 11B is the characteristics of the leakage of the high frequency signal without the filter circuit.

In the case of the high frequency semiconductor switch, the high frequency signal leaks to the control circuit, for example, this frequency and the charge pump frequency in the power circuit will be mutually modulated. As a result, the frequency (reception band) signal that is different from the transmission frequency occurs.

As shown in FIG. 11A, because the filter circuit is provided in this embodiment, it is possible to suppress the signal level of a signal f1 (1.936 GHz), which is the frequency (reception band) signal.

Figure 11B:
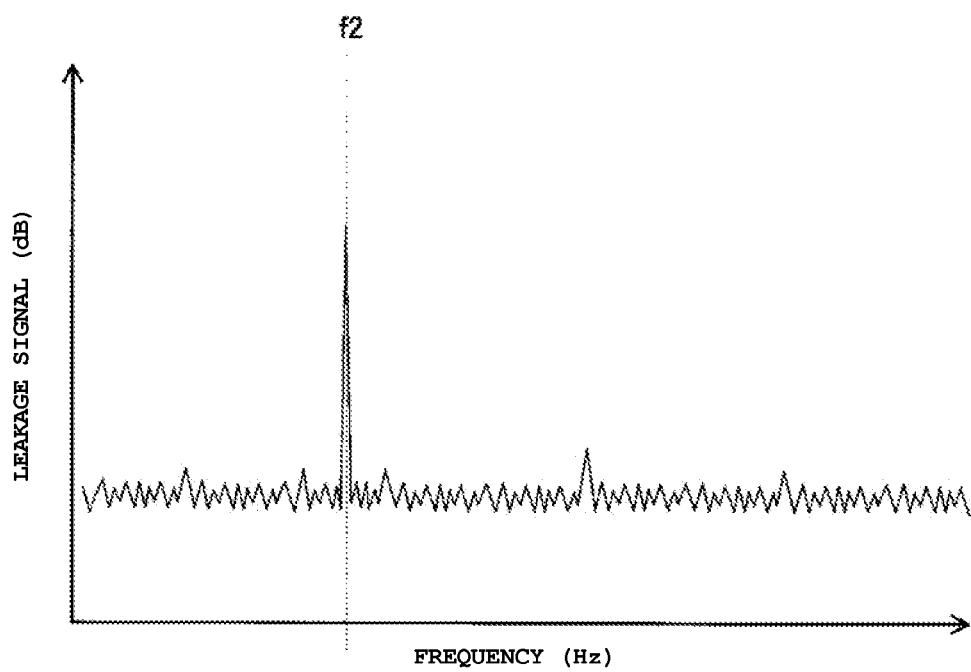

On the other hand, as show in FIG. 11B, in the case when the filter circuit is not provided, it is not possible to suppress the signal level of a signal f2 (1.939 GHz) which is the frequency (reception band) signal.

Figure 12:
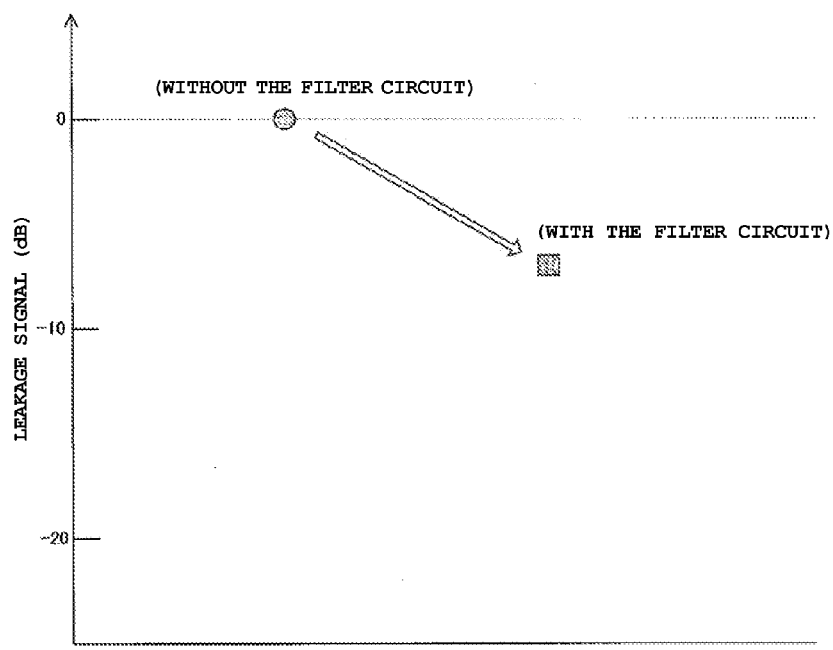
FIG. 12 is a graph illustrating the leakage of the high frequency signal in accordance with the third embodiment.

To be more specific, as shown in FIG. 12, by providing the filter circuit, compared with the case when no filter circuit is provided, 7.2 dB of leakage signals can be reduced.

As described in the above paragraphs, in the high frequency semiconductor switch of this embodiment, the high frequency semiconductor switch chip 110 that has the control circuit 10, the shunt FET parts SHUt1 to SHUtn, the through FET parts THRt1 to THRtn, the control wires 23 to 25, the signal wire 26, the grounding wire 27, the filter circuit 91, the filter circuit 92, the antenna terminal Pant, the RF terminals Prf1 to Prfn, the terminal Pvdd, the terminal P1, the terminal P2, and the grounding terminals Pvss1 to Pvss6 is provided. The filter circuit 91 is configured on the right upper part of the high frequency semiconductor switch chip 110. The filter circuit 92 is configured on the right lower part of the high frequency semiconductor switch chip 110.

Therefore, by the filter circuit 91 and the filter circuit 92, it is possible to greatly suppress the leakage of the high frequency signal to the control circuit 10.

Fourth Embodiment

Figure 13:
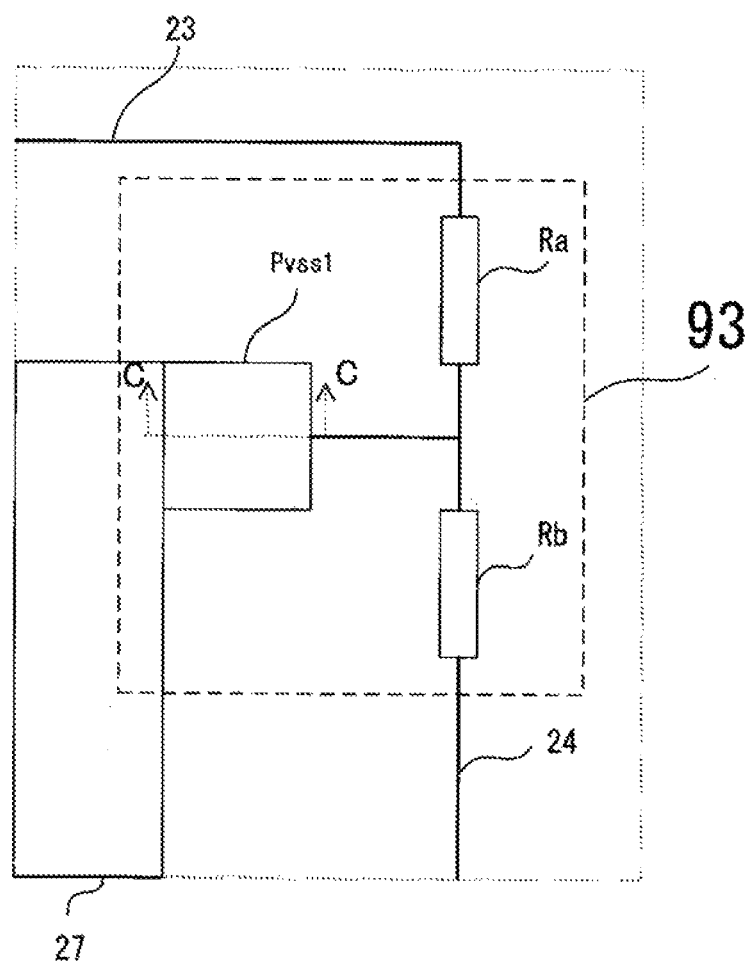
FIG. 13 is an outline plan view illustrating a filter circuit according to a fourth embodiment.
Figure 14:
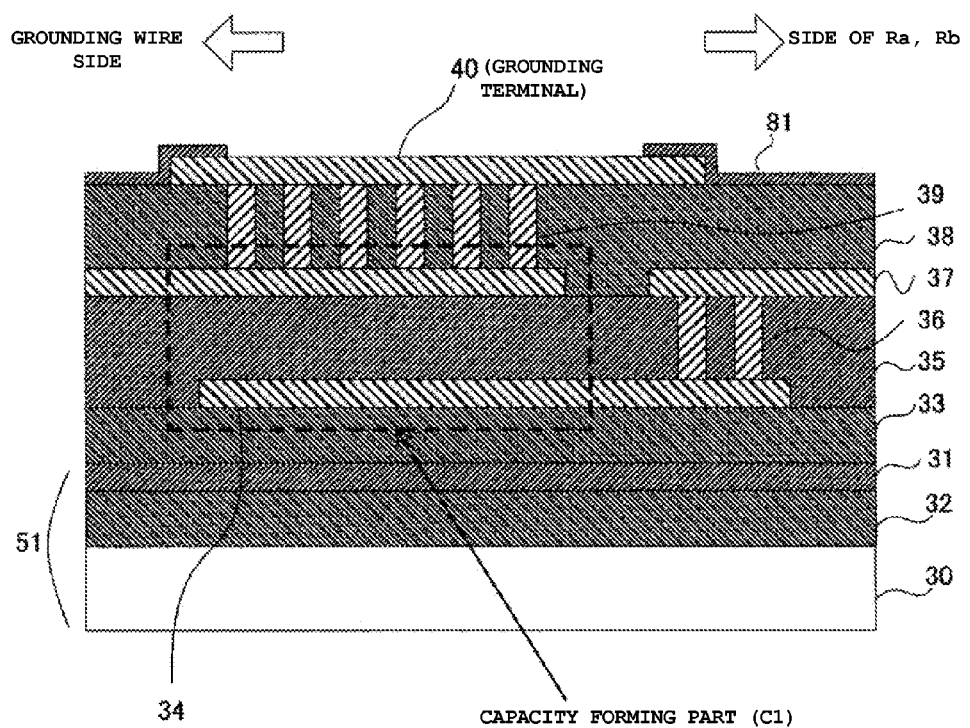
FIG. 14 is a cross-sectional view along the line C-C depicted in FIG. 13.

Next, a high frequency semiconductor switch in accordance with a fourth embodiment is explained with reference to the drawings. FIG. 13 is an outline plan view showing a filter circuit. FIG. 14 is a cross-sectional view along the line C-C in FIG. 13. In this embodiment, the capacitor of the filter circuit is provided directly under the grounding terminal, and the occupied area of the high frequency semiconductor switch chip is reduced.

In the following description, for the parts that are same as the parts in the first embodiment, the same reference numerals are used, and their descriptions are omitted; only the different parts will be described.

As shown in FIG. 13, a filter circuit 93 provided on the side of the odd numbered control wire 23 is configured in the vicinity of the grounding terminal Pvss1, and the capacitor C1 is provided directly under the grounding terminal Pvss1 (as depicted in FIG. 14). In addition, although not shown in the drawings, the same filter circuit 93 can also be provided on the side of the even numbered control wire 24.

As shown in FIG. 14, the capacitor C1 is provided below the grounding terminal Pvss1. To be more specific, the first layer wiring 34 (the resistor Ra and the resistor Rb (one end side)) which is connected to the second layer wiring 37 and the via 36 is provided directly under the grounding terminal Pvss1. The second layer wiring 37 (the grounding wire 27 (the other end side)) connected to the third layer wiring 40 (the grounding terminal Pvss1) and the via 39 is provided directly under the grounding terminal Pvss1.

As described in the above paragraphs, in the high frequency semiconductor switch of this embodiment, the filter circuit is configured in the neighborhood to the grounding terminal, the capacitor C1 of the filter circuit is provided directly under the grounding terminal. The capacitor C1 is formed from the first layer wiring 34 and the second layer wiring 37.

Therefore, compared with the third embodiment, it is possible to reduce the parasitic inductance and to reduce the occupied area of the high frequency semiconductor switch chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high frequency semiconductor switch, comprising:
a switch circuit on a substrate, configured to connect an antenna terminal to a selected one of multiple high frequency terminals;
a control circuit on the substrate and configured to output a control signal for controlling selection of the high frequency terminal by the switch circuit;
a grounding wire disposed between and apart from the switch circuit and the control circuit, the grounding wire extending from a first ground terminal located proximate to a first substrate edge to a second ground terminal located proximate to a second substrate edge opposite the first substrate edge; and
a control wire for carrying the control signal, disposed between an end of the grounding wire connected to the first ground terminal and the first substrate edge, wherein the end is one of the two ends of the grounding wire that is closer to the first substrate edge.

2. The high frequency semiconductor switch according to claim 1, further comprising:
   a resistor connected between the control circuit and an end of the control wire, the resistor located on a same side of the grounding wire as the control circuit.

3. The high frequency semiconductor switch according to claim 1, further comprising:
   a filter connected between the control circuit and an end of the control wire, the filter located on a same side of the grounding wire as the control circuit.

4. The high frequency semiconductor switch according to claim 3, wherein the filter includes a resistor and a capacitor connected in series between the end of the control wire and the first grounding terminal.

5. The high frequency semiconductor switch according to claim 3, wherein the filter includes:
   a first resistor with a first end connected to the switch circuit;
   a second resistor with a third end connected to a second end of the first resistor and a fourth end connected to the control circuit;
   a capacitor with a fifth end connected to the second end and the third end and a sixth end connected to the first grounding terminal.

6. The high frequency semiconductor switch according to claim 5, wherein a portion of the capacitor is disposed under the grounding terminal in one or more wiring layers below the grounding terminal.

7. The high frequency semiconductor switch according to claim 3, wherein the filter is a low pass filter.

8. The high frequency semiconductor switch according to claim 1, wherein the control wire, when viewed in a cross-section perpendicular to a direction in which the control wire extends, is surrounded by an additional grounding wire.

9. The high frequency semiconductor switch according to claim 8, wherein the additional grounding wire includes wiring layers and vias connecting the wiring layers.

10. The high frequency semiconductor switch according to claim 1, wherein connection bumps are provided on terminals of the switch circuit and the control circuit.

11. The high frequency semiconductor switch according to claim 10, wherein the switch circuit and the control circuit are connected to an external circuit through one or more of the connection bumps.

12. The high frequency semiconductor switch according to claim 1, wherein the grounding wire comprises portions formed from two or more wiring layers.

13. The high frequency semiconductor switch according to claim 12, wherein the grounding wire further comprises portions formed as vias connecting the wiring layers.

14. The high frequency semiconductor switch according to claim 13, further comprising a n+ type layer formed below the grounding wire, the n+ type layer being in electrical contact with the grounding wire.

15. A high frequency semiconductor switch, comprising:
   a substrate with a first face having a first edge and a second edge opposite the first edge;
   a switch circuit formed on the first face in a switch circuit region located between the first edge and the second edge;
   a control circuit formed on the first face in a control circuit region located between the first edge and the second edge and to not overlap with the switch circuit region, the control circuit being configured to output a control signal for controlling an operation of the switch circuit;
   a grounding wire formed on the first face between the control circuit region and the switch circuit region, the grounding wire extending from a first end that is proximate to the first edge to a second end that is proximate to the second edge such that the grounding wire is closer to the first edge and the second edge than each of the switch circuit region and the control circuit region; and
   a control wire for carrying the control signal output from the control circuit to the switch circuit, the control wire having a portion disposed between the first edge and the first end, wherein the first end is the end of the grounding wire that is closer to the first edge.

16. The high frequency semiconductor switch of claim 15, wherein the switch circuit is configured to connect an antenna terminal to a high frequency terminal selected from a plurality of high frequency terminals according to the control signal.

17. The high frequency semiconductor switch of claim 15, wherein the substrate is a silicon-on-insulator substrate.

18. The high frequency semiconductor switch of claim 15, wherein a filter is connected between the control circuit and the control wire, the filter formed on the first face on a same side of the first grounding wire as the control circuit region.

19. A semiconductor device module, comprising:
   a circuit substrate;
   one or more electronic components mounted on the circuit substrate;
   an integrated circuit connected to the circuit substrate; and
   a high frequency semiconductor switch according to claim 1 connected to the circuit substrate, wherein the connection between the high frequency semiconductor switch and the circuit substrate is formed using a connection bump.

20. The semiconductor device module of claim 19, wherein the module is installed in a cell phone.

* * * * *